STABILIZED TRANSISTOR AMPLIFIER
Filed May 28, 1965
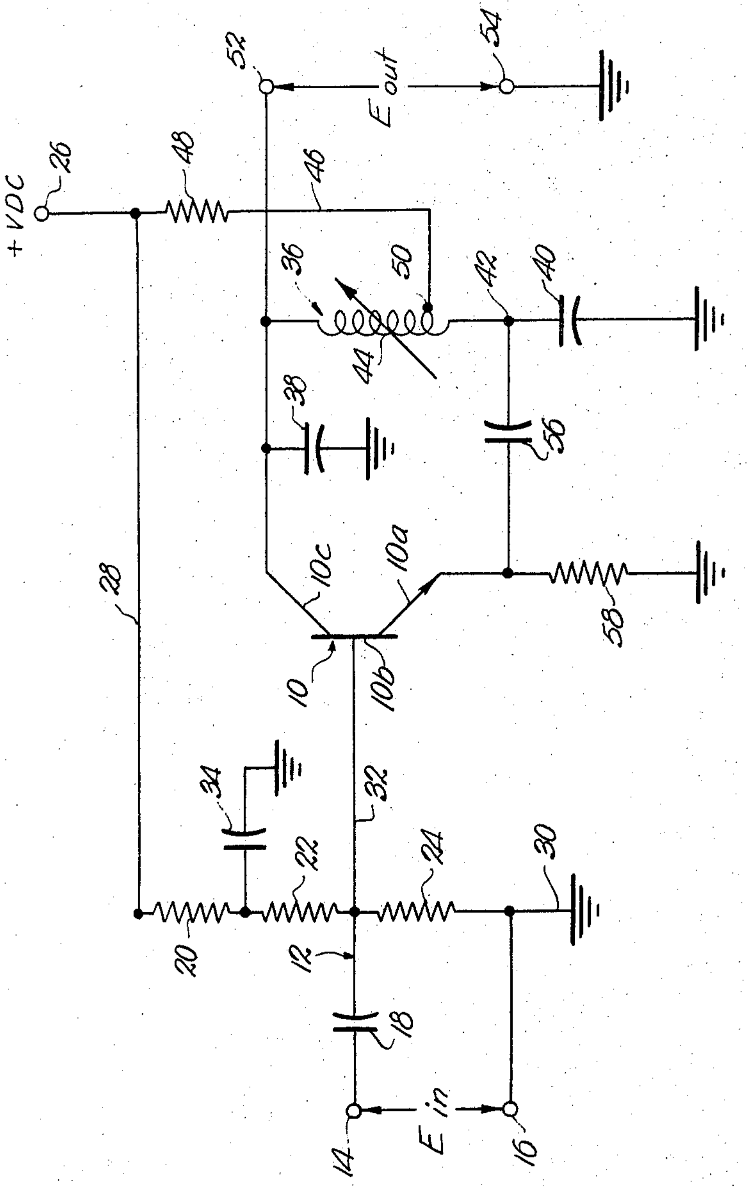
INVENTOR
George W. Woster
BY Hovey, Schmidt, Johnson & Hovey
ATTORNEYS.

3,422,365
Patented Jan. 14, 1969

3,422,365

STABILIZED TRANSISTOR AMPLIFIER

George W. Woster, Mission, Kans., assignor to Wilcox Electric Company, Inc., Kansas City, Mo., a corporation of Kansas Filed May 28, 1965, Ser. No. 459,635
U.S. Cl. 330—28 2 Claims
Int. Cl. H03f *1/08*; H03f *1/34*

ABSTRACT OF THE DISCLOSURE

A tuned transistor amplifier stage in common emitter configuration is stabilized to prevent oscillation by returning a portion of the collector output to the emitter after a 180° phase shift. Ideally, the magnitude of the stabilizing signal should be equal to the internal collector to base feedback of the transistor in order to produce a condition where no net feedback exists between the output and input circuits of the stage.

This invention relates to circuitry for stabilizing tuned amplifiers to prevent undesired oscillation thereof and, more specifically, to means for nullifying the effect of collector to base feedback in a transistor amplifier without resorting to conventional neutralization techniques.

The primary object of this invention is to provide means for stabilizing tuned electronic amplifiers which is more efficient than prior art neutralization schemes that provide external feedback between the collector circuit and the base of the transistor (or the plate circuit and the grid in the case of vacuum tubes).

As a corollary to the above object, it is a specific aim of the instant invention to provide means for inducing a phase shift in the collector output signal of a common emitter transistor amplifier and for then returning a portion of the phase shifted signal to the emitter by a feedback path, whereby to prevent oscillation of the amplifier.

An additional object of this invention is to provide a stabilization technique which, unlike over-neutralization, will not cause phase shift oscillation of the stage in the event that excessive external feedback is obtained.

A further object of the invention is to provide an amplifier stabilization technique which is usable at the maximum frequency of transistor operation.

Other objects will become apparent as the detailed description proceeds.

In the drawing, the single figure is an electrical schematic diagram showing a tuned transistor amplifier stage employing the stabilization means of the instant invention.

The numeral 10 designates a NPN transistor having an emitter element 10*a*, a base element 10*b*, and a collector element 10*c*. An input circuit 12 for the transistor includes input terminals 14 and 16, a RF coupling and D.C. blocking capacitor 18, and bias resistors 20, 22 and 24. The resistors are serially connected to provide a voltage divider bias arrangement, resistor 20 being connected to a positive D.C. supply terminal 26 by a lead 28, while resistor 24 and input terminal 16 are grounded at 30.

Capacitor 18 interconnects input terminal 14 and base 10*b* via lead 32, the latter being connected to a junction between resistors 22 and 24 in conventional fashion. A RF bypass capacitor 34 is connected between the junction of resistors 20 and 22 and ground. It should be understood that the various ground connections illustrated correspond to the negative electrical side of the direct current operating source (not shown).

The output circuit of the stage includes a pi-network tank 36 comprising a capacitor 38 connected between collector 10*c* and ground, a capacitor 40 connected between junction point 42 and ground, and a tunable inductor 44 connected between collector 10*c* and junction point 42. The D.C. operating potential for the transistor collector circuit is provided by a lead 46 which connects collector load and RF decoupling resistor 48 to a zero voltage point tap 50 adjacent the lower end of inductor 44. The output of the stage is taken at terminals 52 and 54, the former being directly connected to collector 10*c* while the latter is maintained at ground potential.

A RF by-pass capacitor 56 is connected between junction point 42 and emitter 10*a* and forms a feedback path for stabilizing the operation of the amplifier, as will be fully discussed hereinafter. An emitter resistor 58 is connected between emitter 10*a* and ground and provides D.C. stabilization and a RF shunt.

It will be appreciated from the illustration of the figure and the foregoing description that transistor 10 is operated in common emitter configuration, a RF input signal $E_{in}$ being applied across terminals 14 and 16. With properly adjusted bias potentials, this produces an output signal $E_{out}$ between output terminals 52 and 54. Inductor 44 is tuned to the frequency of the input signal to provide a tuned stage of amplification. The zero voltage tap 50 is determined by the reactances of capacitors 38 and 40 at the operating frequency. Alternatively, the emitter-collector circuit may be fed at junction point 42 rather than tap 50. Since the use and operation of pi-network tank circuits is well known to those skilled in the art, the selection of the values of the tank components will not be discussed in this specification, it being apparent that the ratio of the values of the capacitors 38 and 40 will be chosen in accordance with the desired performance characteristics of the amplifier, such as gain, temperature characteristics, unilateralization, bandwidth, and RF stability. It should be understood, however, that the values of the tank circuit parameters are chosen so that the output signal at junction point 42 is 180° out of phase with the signal as it appears at collector 10*c* or terminal 52.

Since the impedance between junction point 42 and ground is low relative to the impedance between collector 10*c* and ground, the phase shifted signal appearing at point 42 will have a lesser magnitude than signal $E_{out}$. Thus, only a portion of the output signal appearing at collector 10*c* or terminal 52 is returned to emitter 10*a* via capacitor 56. This fedback signal is utilized to effect stabilization of the stage by nullifying or offsetting the internal collector to base feedback of the transistor. Ideally, the magnitude of the stabilizing signal returned to emitter 10*a* should be equal in magnitude to the collector-base feedback signal. Under this condition there will be no net feedback between the output and input circuits of the stage since the stabilizing signal returned from tank 36 to emitter 10*a* is 180° out of phase with the output signal at collector 10*c*.

Since the impedance at junction point 42 with respect to ground is important to operation of the stabilizing technique, the values of emitter resistor 58 and capacitor 40 are chosen so that the stabilizing signal presented at point 42 will have the proper magnitude. Alternatively, the circuit parameters may be chosen so that point 42 is of sufficiently low impedance to present a stabilizing signal of lesser magnitude than desired for optimum stabilization.

One of the advantages of the instant invention is, in the event that a stabilizing signal of greater magnitude than necessary to offset the collector-base feedback is applied to emitter 10*a*, phase shift oscillation of the stage will not be produced. This is in contrast to conventional neutralization techniques wherein over-neutralization produces this troublesome condition. The only adverse effect caused by the instant invention, in the event of excess feedback from tank 36 to emitter 10*a*, is a reduction of the gain of the stage.

An additional feature of this stabilization scheme is that the instant invention may be utilized with amplifier stages at the maximum frequency of transistor operation and, hence, is not limited to applications where the transistor is operated in the lower portions of its operable frequency range. Furthermore, with this technique output changes due to a change in transistor $\beta$ (current gain) are minimized.

Having thus described the invention, what is claimed as new and desired to be secured by Letters Patent is:

1. A stabilized, tuned amplifier stage comprising:

a transistor having an emitter, a base, and a collector; circuitry coupled with said emitter, base, and collector for applying direct current potentials thereto to operate said transistor in common emitter configuration, said circuitry including an input circuit coupled with said emitter and said base and a tuned, pi-network output circuit coupled with said emitter and said collector;

a pair of output terminals, one of said terminals being connected to said collector;

an electrical connection point, said output circuit having a first capacitor connected between said collector and the other of said terminals, an inductor connected between said collector and said point, and a second capacitor connected between said point and said other terminal; and a third capacitor connected between said point and said emitter, whereby to provide a feedback path through said third capacitor to prevent oscillation of the stage upon application of an input signal to said base by returning a portion of the collector output signal to the emitter after a 180° phase shift.

2. The invention of claim 1, wherein said circuitry includes a resistor coupled between said emitter and said other terminal.

References Cited

UNITED STATES PATENTS

| | | | |
|---|---|---|---|
| 2,404,809 | 7/1946 | O'Brien | 330—78 |
| 2,808,472 | 10/1957 | Meewezen | 330—192 XR |
| 2,983,876 | 5/1961 | Tongue | 330—107 XR |

FOREIGN PATENTS

| | | |
|---|---|---|
| 906,577 | 5/1945 | France. |

JOHN KOMINSKI, *Primary Examiner.*

U.S. Cl. X.R.

330—31, 176, 27 94, 107